US010277106B2

(12) United States Patent
Nakagomi

(10) Patent No.: US 10,277,106 B2
(45) Date of Patent: Apr. 30, 2019

(54) CONTROL CIRCUIT FOR SWITCHING POWER SUPPLY APPARATUS

(71) Applicant: FUJI ELECTRIC CO., LTD., Kawasaki (JP)

(72) Inventor: Kenji Nakagomi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/639,221

(22) Filed: Jun. 30, 2017

(65) Prior Publication Data

US 2018/0019657 A1    Jan. 18, 2018

(30) Foreign Application Priority Data

Jul. 14, 2016  (JP) ................... 2016-139429

(51) Int. Cl.
*H02M 1/08*  (2006.01)
*H02M 3/335*  (2006.01)
*H03K 3/64*  (2006.01)
*H03K 5/24*  (2006.01)
*H02M 1/00*  (2006.01)

(52) U.S. Cl.
CPC ......... *H02M 1/08* (2013.01); *H02M 3/33515* (2013.01); *H03K 3/64* (2013.01); *H03K 5/249* (2013.01); *H03K 5/2481* (2013.01); *H02M 2001/0032* (2013.01); *Y02B 70/16* (2013.01)

(58) Field of Classification Search
CPC ......... H02M 3/33507; H02M 3/33515; H02M 3/33523; H02M 1/36; H02M 2003/1566; H03K 5/2481
See application file for complete search history.

(56) References Cited

U.S. PATENT DOCUMENTS

| | | | | | |
|---|---|---|---|---|---|
| 4,835,417 | A | * | 5/1989 | Kousaka | ............... H03K 5/2481 327/312 |
| 5,440,248 | A | * | 8/1995 | Brown | ................... H03K 3/037 326/121 |
| 5,488,320 | A | * | 1/1996 | Carvella | ............... H03K 5/2481 327/203 |
| 6,339,344 | B1 | * | 1/2002 | Sakata | ........... H03K 19/018528 326/83 |
| 6,411,133 | B1 | * | 6/2002 | Matsudai | ............. H03K 5/2481 327/427 |

(Continued)

FOREIGN PATENT DOCUMENTS

JP    2004-208382    7/2004

*Primary Examiner* — Thomas J. Hiltunen

(57) ABSTRACT

A control circuit 2a for a switching power supply apparatus includes a comparator COMPa for comparing a voltage corresponding to a current flowing through a switching element PT1 with a voltage to be compared therewith, and outputting a comparison signal corresponding to a result of the comparison. To the comparator, a blanking pulse signal is also input. Here, the blanking pulse signal indicates whether or not it is currently in a predetermined period that is set for ensuring that the switching element is not turned off for the predetermined period after the switching element has been turned on. When the blanking pulse signal indicates that it is currently in the predetermined period, the comparison signal is set to low level independently of the voltage corresponding to the current and the voltage to be compared therewith.

4 Claims, 13 Drawing Sheets

(56) References Cited

U.S. PATENT DOCUMENTS

| | | | | | |
|---|---|---|---|---|---|
| 6,420,909 | B1* | 7/2002 | Barnes | H03F 3/45479 | 327/63 |
| 6,426,662 | B1* | 7/2002 | Arcus | H03K 3/0231 | 327/274 |
| 6,897,684 | B2* | 5/2005 | Oi | H03K 19/01855 | 326/86 |
| 6,963,230 | B2* | 11/2005 | Morishita | G05F 1/465 | 327/77 |
| 7,298,182 | B2* | 11/2007 | Kim | G11C 11/406 | 327/65 |
| 2005/0239433 | A1* | 10/2005 | Klein | G11C 7/1078 | 455/343.2 |
| 2005/0275435 | A1* | 12/2005 | Kim | G11C 11/406 | 327/77 |
| 2006/0022706 | A1* | 2/2006 | Do | H03K 5/2481 | 326/57 |
| 2008/0198525 | A1* | 8/2008 | Janssen | H03K 17/0828 | 361/93.1 |
| 2009/0267583 | A1* | 10/2009 | Hsu | H02M 3/33507 | 323/284 |
| 2012/0327691 | A1* | 12/2012 | Strijker | H02M 1/32 | 363/21.01 |

* cited by examiner

CONTROL CIRCUIT FOR SWITCHING POWER SUPPLY APPARATUS

CROSS-REFERENCE TO RELATED APPLICATION

This application claims priority from Japanese Patent Application No. 2016-139429 filed on Jul. 14, 2016, which is incorporated herein by reference in its entirety.

TECHNICAL FIELD

The present invention relates to a control circuit for a switching power supply apparatus.

BACKGROUND ART

Patent Document 1 discloses a control circuit for a switching power supply apparatus including an on-blanking pulse generating circuit. The on-blanking pulse generating circuit outputs a blanking pulse signal that ensures that a switching element is not turned off for a fixed interval of time after the switching element has been turned on.

One form of a conventional switching power supply apparatus having a blanking function will be described with reference to FIG. 6. FIG. 6 shows a switching power supply apparatus 1 configured as a flyback DC-DC converter. In the switching power supply apparatus 1, the output voltage is controlled by PWM (pulse width modulation), and the output is stabilized by a current mode control method. An alternating current power supply AC and a load L is connected to the switching power supply apparatus 1.

In the switching power supply apparatus 1, an alternating current supplied from the alternating current power supply AC is full-wave rectified by a bridge diode BD1. The direct current converted by such full-wave rectification is smoothed by a capacitor C1, and then supplied to the series circuit of a primary-side winding Tn1 of an output transformer T1 and a switching element PT1. The switching element PT1 is, for example, an N-type power MOSFET. A control circuit 2 controls the switching operation of the switching element PT1 such that a pulsating current is generated in the secondary-side winding Tn2 of the output transformer T1. This pulsating current is rectified by a diode D2 and smoothed by a capacitor C3, thereby converted into a direct current. This direct current is supplied to the load L.

The switching power supply apparatus 1 includes a voltage detection circuit VDC for detecting an output voltage to the load L. To this voltage detection circuit VDC, a light-emitting element PC1a of a photo coupler is connected in parallel. A light-receiving element PC1b of the photo coupler is connected to a feedback terminal FB provided in the control circuit 2. The detection value of the voltage detection circuit VDC is input as a feedback signal to the feedback terminal FB of the control circuit 2 via the photo coupler.

The control circuit 2 also includes a power supply terminal VCC to which a power supply voltage is input. Specifically, the voltage input to the power supply terminal VCC is a direct current voltage obtained by converting the output of an auxiliary winding Tn3 of the output transformer T1 through rectification by a diode D1 and smoothing by a capacitor C2.

The control circuit 2 also includes a current detection terminal CS to which a current detection signal is input. The current detection signal indicates a voltage into which the current flowing through the switching element PT1 is converted by a current detection resistor Rs.

The control circuit 2 also includes an output terminal OUT for outputting a switching control signal for controlling the switching operation of the switching element PT1. This switching control signal is applied to the gate of the switching element PT1. The control circuit 2 further includes a ground terminal GND connected to ground level.

FIG. 7 shows the configuration of the control circuit 2. An oscillator circuit 3, provided in the control circuit 2, outputs a clock signal Clock. The clock signal Clock is input to a blanking pulse generating circuit 4. The blanking pulse generating circuit 4 outputs a blanking pulse signal T_blank. The blanking pulse signal T_blank is input to a set terminal of a set-dominant RS flip-flop circuit RS-FF1. The blanking pulse generating circuit 4 and the blanking pulse signal T_blank will be described more later.

The RS flip-flop circuit RS-FF1 outputs a switching control signal. The switching control signal is sent to the output terminal OUT of the control circuit 2 by way of a buffer B. The output terminal OUT of the control circuit 2 is connected to the gate of the switching element PT1 by way of a limiting resistor RO. With this configuration, when the voltage of the switching control signal is high level, the switching element PT1 is turned on.

The control circuit 2 further includes a current detection comparator COMP and a slope generation circuit 5. The current detection signal is input to the positive input terminal (non-inverting input terminal) of the current detection comparator COMP by way of the current detection terminal CS. The slope signal V_slope output from the slope generation circuit 5 is input to the negative input terminal (inverting input terminal) of the current detection comparator COMP. The current detection comparator COMP compares the current detection signal with the slope signal V_slope and outputs a comparison signal corresponding to a result of the comparison. The comparison signal is input to a reset terminal of the RS flip-flop circuit RS-FF1.

When the current detection signal exceeds the slope signal V_slope, the current detection comparator COMP outputs a high-level comparison signal. Upon receiving this high-level comparison signal, the RS flip-flop circuit RS-FF1 is reset. As a result, the output of the RS flip-flop circuit RS-FF1 becomes low level, and the switching element PT1 becomes turned off in response.

The control circuit 2 also includes a feedback circuit 6 connected to the power supply terminal VCC, the feedback terminal FB, the ground terminal GND, the oscillator circuit 3, and the slope generation circuit 5. The feedback circuit 6 includes a bipolar transistor BT61, diodes D61 and D62, and resistors R61 to R65. The bipolar transistor BT61 constitutes an emitter follower circuit for the internal power supply (5 V), and supplies a voltage (5 V, which is the forward voltage of the diode having a base and an emitter) based on the internal power supply (5 V) to a circuit formed of the diodes D61, D62 and the resistors R61 to R65. The resistor R61 pulls up the light receiving element PC1b of the photo coupler. The voltage (feedback signal) of the feedback terminal FB is obtained by dividing the output voltage (5 V, which is the forward diode voltage) of the emitter follower circuit formed of the bipolar transistor BT61 between the resistor R61 and the on resistance of the light receiving element PC1b of the photo coupler. Here, as the output voltage increases, the amount of light emitted from the light-emitting element PC1a of the photo coupler increases, and the on resistance of the light receiving element PC1b falls. As a result, the voltage (feedback signal) of the feedback terminal FB decreases. On the other hand, as the output voltage decreases, the amount of light emitted by the light emitting element PC1a of the photo coupler decreases, and the on resistance of the light receiving element PC1b rises. As a result, the voltage (feedback signal) of the feedback terminal FB increases.

The feedback circuit 6 outputs the voltage (feedback signal) VFB of the feedback terminal FB to the oscillator circuit 3 via the diode D61. In addition, the feedback circuit 6 outputs, to the slope generation circuit 5, a signal obtained by reducing the voltage (feedback signal) VFB of the feedback terminal FB using the diode D62 and then dividing the resultant voltage using a voltage dividing circuit including the resistors R62 to R65 (signal thus obtained will be simply referred to as a voltage-divided signal or voltage-divided value, below).

As the load L decreases, the output voltage to the load L will increase accordingly. As a result, the feedback signal VFB, which is the voltage of the feedback terminal FB, decreases as described above.

The slope generation circuit 5 outputs the slope signal V_slope, which corresponds to a signal input from the voltage-dividing circuit in the feedback circuit 6. While not described in detail, the slope generation circuit 5 is configured to output, as the slope signal V_slope, a signal obtained by adding a signal for monotonic decrease to the voltage-divided value of the feedback signal VFB (thus, the signal output by the slope generation circuit 5 monotonically decreases from its initial value, i.e., the voltage-divided value of the feedback signal VFB) in order to prevent subharmonic oscillation (switching frequency fluctuation in the audible frequency range). This slope signal is compared with the current detection signal in the current detection comparator COMP. In accordance with the comparison, the duty cycle of the switching control signal output from the output terminal OUT is set such that the switching power supply apparatus 1 outputs a voltage of a set value without generating any audible noises.

Next, referring to FIG. 8, the configuration of the current detection comparator COMP will be described. The current detection comparator COMP operates with a voltage supply of 5 V. The voltage of 5 V is supplied to constant current sources bias1 and bias2 in the current detection comparator COMP.

The positive input terminal and the negative input terminal of the current detection comparator COMP are connected to the gate of a P-type MOS transistor P2 and the gate of a P-type MOS transistor P1, respectively. The constant current source bias1 is connected to the sources of the P type MOS transistors P1 and P2. The P-type MOS transistors P1 and P2 form a differential pair.

A current mirror circuit MC including N-type MOS transistors N1 and N2 is connected to the drains of the P-type MOS transistors P1 and P2. The sources of the transistors N1 and N2 are both connected to ground. The drain and the gate of the transistor N1 are connected to each other and serve as the input terminal of the current mirror circuit MC. The drain of the transistor N2 corresponds to the output terminal of the current mirror circuit MC.

An N-type MOS transistor N3 is connected to ground and to the constant current source bias2. The gate of the N-type MOS transistor N3 is connected to the drains of the P-type MOS transistor P2 and the N-type MOS transistor N2. The drain of the N-type MOS transistor N3 and the constant current source bias2 are connected to the output terminal comp out of the current detection comparator COMP.

The constant current source bias1, the P-type MOS transistors P1 and P2 of the differential pair, and the N-type MOS transistors N1 and N2 constitute a differential portion of the current detection comparator COMP. The constant current source bias2 and the N-type MOS transistor N3 constitute an output portion of the current detection comparator COMP. One output of the differential portion (the drain of the P-type MOS transistor P2) is input to the output portion.

Here, referring back to FIG. 6, when the switching element PT1 is turned on, a surge current is generated by discharge of the capacitance of the main circuit, a gate drive current, or the like. This surge current brings the voltage of the comparison signal of the current detection comparator COMP to high level. If the RS flip-flop circuit RS-FF1 is reset in response, the terminal voltage of the output terminal OUT becomes low level. As a result, the switching element PT1 is turned off. In other words, in such case, the switching element PT1 is turned off immediately after being turned on, which means that the switching power supply apparatus 1 is not normally controlled.

To avoid such a situation, the blanking pulse generating circuit 4 shown in FIG. 7 is provided. The blanking pulse generating circuit 4 generates the blanking pulse signal T_blank whose voltage is kept at high level for a predetermined period from the rise of the clock signal Clock of the oscillator circuit 3. Such predetermined period may be referred to as a blanking period. The blanking period is around several hundred nanoseconds, for example.

As described above, the blanking pulse signal T_blank is input to the set terminal of the set-dominant RS flip-flop circuit RS-FF1. Thus, in the blanking period, the terminal voltage of the output terminal OUT is kept at high level independently of the comparison signal from the current detection comparator COMP.

FIG. 9 shows the configuration of the blanking pulse generating circuit 4. The input terminal 41 of the blanking pulse generating circuit 4 is connected to the set terminal of a reset-dominant RS flip-flop circuit RS-FF2 and the input terminal of an inverter INV1. The output terminal of the inverter INV1 is connected to the input terminal of the inverter INV2 and the output terminal of the inverter INV2 is connected to the reset terminal of the RS flip-flop circuit RS-FF2 via a resistor R11. The Q output terminal of the RS flip-flop circuit RS-FF2 is connected to the output terminal 42 of the blanking pulse generating circuit 4.

The blanking pulse generating circuit 4 further includes an N-type MOS transistor N91. The drain of the N-type MOS transistor N91 is connected to the output side of the resistor R11 and to the reset terminal of the RS flip-flop circuit RS-FF2. The source of the N-type MOS transistor N91 is connected to ground. The gate of the N-type MOS transistor N91 is connected to the output terminal of the inverter INV1.

The blanking pulse generating circuit 4 further includes a capacitor C11. One end of the capacitor C11 is connected to the drain of the N-type MOS transistor N91 and to the reset terminal of the RS flip-flop circuit RS-FF2. The other end of the capacitor C11 is connected to ground.

FIG. 10 is a timing chart showing the operation of the blanking pulse generating circuit 4. In FIG. 10, (a) shows changes in the clock signal Clock (having a period dt), and (b) shows changes in an output INV1_out of the inverter INV1. Also, (c) shows changes in a reset signal Reset input to the reset terminal of the RS flip-flop circuit RS-FF2, and (d) shows changes in the blanking pulse signal T_blank. The reference symbol BL indicates a blanking period.

When the clock signal Clock is low level, the output INV1_out of the inverter INV1 is high level. Accordingly, the N-type MOS transistor N91 is turned on (conductive), so that the reset signal Reset of the RS flip-flop circuit RS-FF2 is low level. Meanwhile, the set of the RS flip-flop circuit RS-FF2 is also low level. Thus, the RS flip-flop circuit RS-FF2 holds the current state.

When the clock signal Clock rises to high level under these conditions, the set signal of the RS flip-flop circuit RS-FF2 becomes high level, so that the RS flip-flop circuit RS-FF2 is set. In response, the blanking pulse signal T_blank, which is the Q output of the flip-flop circuit RS-FF2, becomes high level.

Meanwhile, when the clock signal Clock becomes high level, the output INV1_out of the inverter INV1 becomes low level and the output INV2_out of the inverter INV2 becomes high level, so that the N-type MOS transistor N91 is turned off (cutoff). Thus, the high-level output INV2_out of the inverter INV2 is applied to a time constant circuit comprising the resistor R11 and the capacitor C11. As a result, the reset signal Reset of the RS flip-flop circuit RS-FF2, which is the charge voltage of the capacitor C11, is rising.

When the reset signal Reset rises and reaches the threshold voltage (2.5 V shown in (c) of FIG. 10) for the reset terminal of the RS flip-flop circuit RS-FF2, the RS flip-flop circuit RS-FF2 recognizes that its reset input becomes high. At that time, the set input of the RS flip-flop circuit RS-FF2 is high level, too. However, being reset-dominant, the RS flip-flop circuit RS-FF2 is reset. In response, the blanking pulse signal T_blank, which is the Q output of the flip-flop circuit RS-FF2, becomes low level.

Then, when the clock signal Clock falls to low level, the reset input and the set input of the RS flip-flop circuit RS-FF2 simultaneously become low level as described above. Thus, the blanking pulse signal T_blank, which is the Q output of the flip-flop circuit RS-FF2, maintains low level.

Next, the operation of the control circuit 2 under heavy load will be described with reference to FIG. 11. In FIG. 11, (a) shows the clock signal Clock (having the period dt) of the oscillator circuit 3, and (b) shows the blanking pulse signal T_blank. Also, (c) shows the slope signal V_slope and the voltage VCS (i.e., the terminal voltage of the current detection terminal CS) corresponding to the current flowing through the switching element PT1. In FIG. 11, "VFB" represents the voltage of the feedback terminal FB and "Vf" represents the forward voltage of the diode provided in the voltage-dividing circuit of the feedback circuit 6. Also, "/4" in "(VFB−Vf)/4" indicates that the voltage division ratio between the resistors R62 to R65 is 1/4. In addition, (d) shows the comparison signal outputted by the current detection comparator COMP, and (e) shows the voltage VOUT of the output terminal OUT of the control circuit 2. Note that, in FIG. 11, the voltage of the power supply terminal VCC, i.e., the power supply voltage, is also represented by VCC.

First, at time point t0, the clock signal Clock rises. In response, the blanking pulse signal T_blank becomes and remains high level during a period from time point t0 to time point tB. The period from time point t0 to time point tB is the blanking period BL. When the blanking pulse signal T_blank becomes high level, the RS flip-flop circuit RS-FF1 is set and the voltage VOUT becomes high level. In response, the switching element PT1 becomes turned on, and a surge voltage SG due to a surge current is generated. As a result, the output of the current detection comparator COMP becomes and remains high level from time point t0 to time point t1, and goes back to low level after that. Here, time point t1 is prior to time point tB. As described above, the blanking period is set longer than the surge current generation period so that the influence of the surge voltage SG due to the surge current ends during the blanking period. During the blanking period, the high-level blanking pulse signal T_blank is input as a set signal to the RS flip-flop circuit RS-FF1. Being set-dominant, the RS flip-flop circuit RS-FF1 maintains its output at high level during the blanking period. Thus, the voltage VOUT also maintains high level independently of the comparison signal of the current detection comparator COMP.

Then, at time point t2, which is later than time point tB, the voltage VCS exceeds the slope signal V_slope. The detection that the voltage VCS has exceeded the slope signal V_slope after the end of the blanking period is also referred to as normal current detection. Upon the normal current detection, the comparison signal of the current detection comparator COMP becomes high level, and the voltage VOUT becomes low level. Thus, the voltage VOUT is kept at high level from time point t0 to time t2. When voltage VOUT becomes low level, the switching element PT1 becomes turned off. In response, the voltage VCS, which is the current detection signal, goes back to low level.

The duty cycle (on-time ratio) of the voltage VOUT can be expressed as (t2−t0)/dt. Under heavy load, the duty cycle of the voltage VOUT is relatively large. Thus, the period from time point tB at which the blanking period BL ends to time point t2 at which the voltage VOUT becomes the low level is relatively long.

Next, the operation of the control circuit 2 under light load will be described with reference to FIG. 12. As shown in FIG. 12, a surge voltage SG due to a surge current is generated during the blanking period BL (period from time point t0 to time point tB). Such generation of the surge voltage SG due to the surge current brings the comparison signal of the current detection comparator COMP to high level.

After the surge current generation, the comparison signal is going back to low level. However, before actually reaching the threshold voltage of the reset terminal of the RS flip-flop circuit RS-FF1 (the comparison signal is determined to be low level if it is lower than that threshold voltage), the comparison signal rises again. This is because the comparator COMP, which has a limited slew rate, superimposes an impact of a rapid increase of the voltage VCS on the comparison signal at that time. Therefore, the comparison signal is kept at high level during the period (period from time point t0 to time point t3) until the voltage VCS exceeds the slope signal V_slope at time point t3 immediately after the end of the blanking period, that is, at time point t3 of normal current detection. On the other hand, the blanking period BL ends at time point tB, which is prior to time point t3. Thus, at time point tB, the comparison signal resets the RS flip-flop circuit RS-FF1, and the voltage VOUT becomes low level.

In FIG. 12, (c) shows the comparison signal SIG of the current detection comparator COMP and the input threshold TH of the reset terminal of the RS flip-flop circuit RS-FF1. Note that the levels of the comparison signal SIG and the input threshold TH are shown smaller than the actual values so as to be comparable to that of the slope signal V_slope. In response to the surge current detection, the voltage of the comparison signal SIG exceeds the input threshold TH and becomes high level. After that, the voltage of the comparison signal SIG decreases, but rises again due to normal current detection before falling below the input threshold TH. In other words, the voltage of the comparison signal SIG does not fall below the input threshold TH in the period from the surge current detection to the normal current detection. In FIG. 10, (d) shows the low/high of the comparison signal SIG recognized by the reset terminal of the RS flip-flop circuit RS-FF1 to which the comparison signal SIG is input.

In the control circuit 2 shown in FIG. 7, the comparison signal is originally intended to become high level by detection of the surge voltage SG due to the surge current, then go back to low level once, and becomes high level again in response to the normal current detection, regardless of the length of the period from the surge current detection to the normal current detection. Accordingly, the voltage VOUT is originally intended to be kept at high level from time point t0 to time point t3, which is the normal current detection timing.

However, in practice, as shown in FIG. 12, when the period from the surge current detection to the normal current detection is short, the comparison signal becomes high level in response to detection of the surge voltage SG due to the surge current and remains high level until the next normal current detection, since the slew rate of the comparator COMP is not infinite. As a result, the voltage VOUT maintains high level not during the period from time point t0 to time point t3, but only in the period from time point t0 to time point tB, which is prior to time point t3.

As described above, the period during which the voltage VOUT is kept at high level, i.e., the ON time of the switching element PT1, is equal to the blanking period BL, which is shorter than the intended ON time. This is because the current detection comparator COMP cannot distinguish between surge current detection and normal current detection if an interval from surge current detection to normal current detection is too short.

FIG. 13 shows the relationship between the magnitude of the load and the ON time of the switching element PT1. In FIG. 13, it is assumed that load magnitudes LO1 and LO2 are both light, and the load magnitude LO1 is lighter than the load magnitude LO2. Also, it is assumed that time period TO1 is shorter than time period TO2. Further, the relationship between the magnitude of the load and the intended ON time is indicated by dotted line G1, and the relationship between the magnitude of the load and the actual ON time is indicated by solid line G2.

As indicated by dotted line G1, the intended ON time when the magnitude of the load is equal to or less than LO1 is time TO1. Time TO1 has a length equal to the blanking period BL. When the magnitude of the load is larger than LO1, the intended ON time increases linearly as the magnitude of the load increases. The intended ON time when the magnitude of the load is equal to LO2 is time TO2.

As indicated by solid line G2, the actual ON time when the magnitude of the load is equal to or less than LO1 is time TO1, which is equal to the intended ON time. When the magnitude of the load is larger than LO1 and smaller than LO2, the actual ON time is time TO1, which is shorter than the intended ON time. When the magnitude of the load is LO2, the actual ON time irregularly goes up and down between time TO1 and time TO2. When the magnitude of the load is larger than LO2, the actual ON time increases linearly as the magnitude of the load increases, like the intended ON time.

As described above, when the magnitude of the load is larger than LO1 and smaller than LO2, the actual ON time is shorter than the intended ON time. Moreover, when the magnitude of the load is around LO2, the actual ON time irregularly goes up and down between time TO1 and time TO2. In other words, the actual duty cycle does not change continuously. Such irregular and discontinuous change of the duty cycle might cause sound (audible sound) generation in the switching power supply apparatus 1 (when the discontinuous change between time TO1 and time TO2 is subjected to Fourier transform, the resultant frequencies may include ones in the audible range).

PRIOR ART DOCUMENT

Patent Document

[Patent Document 1] JP 2004-208382 A

SUMMARY OF INVENTION

Technical Problems

The inventor of the present invention has discovered that a switching power supply apparatus provided with a control circuit having a blanking function can possibly generate sounds under light load. This problem may be particularly noticeable in the switching power supply apparatus disclosed in Patent Document 1, since the blanking period becomes shorter when the load is light. The present invention aims to overcome such disadvantage and thus to suppress sound generation under light load.

Solution to Problems

To achieve the above object, a control circuit for a switching power supply apparatus according to one aspect of the present invention includes a comparator for comparing a voltage corresponding to a current flowing through a switching element in the switching power supply apparatus with a voltage to be compared therewith, and outputting a comparison signal corresponding to a result of the comparison. To the comparator, a blanking pulse signal is also input. Here, the blanking pulse signal indicates whether or not it is currently in a predetermined period that is set for ensuring that the switching element is not turned off for the predetermined period after the switching element has been turned on. When the blanking pulse signal indicates that it is currently in the predetermined period, the comparison signal is set to low level independently of the voltage corresponding to the current flowing through the switching element and the voltage to be compared therewith.

According to another aspect, the comparator includes a differential portion and an output portion to which one output of the differential portion is input. When the blanking pulse signal indicates that it is currently in the predetermined period, the one output of the differential portion is fixed to high level or low level.

According to still another aspect, the comparator further includes a switch for connecting the one output of the differential portion to a reference voltage of the control circuit when the blanking pulse signal indicates that it is currently in the predetermined period.

According to still another aspect, the differential portion of the comparator includes a differential pair and a current mirror circuit connected to the differential pair, the current mirror circuit having an output terminal connected to the output par, and the comparator further includes a switch for connecting an input terminal of the current mirror circuit to a reference voltage of the control circuit when the blanking pulse signal indicates that it is currently in the predetermined period Advantageous Effects of Invention According to one aspect of the present invention, it is possible to suppress sound generation under light load.

DESCRIPTION OF EMBODIMENTS

Below, embodiments of the present invention will be described. Note however that the present invention is not limited to the embodiments described below.

First Embodiment

Figure 1:
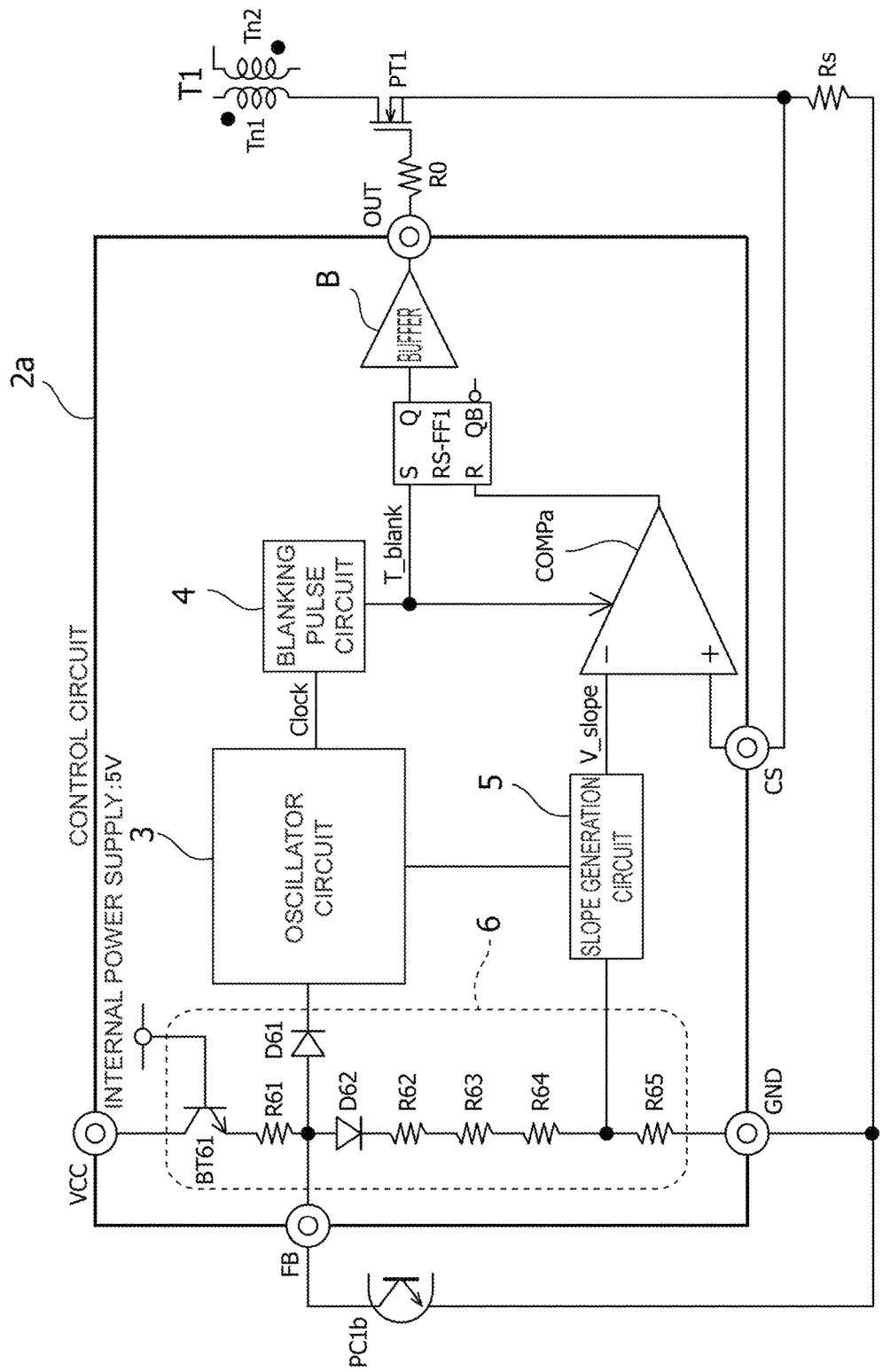
FIG. 1 illustrates a first embodiment of a control circuit.
Figure 7:
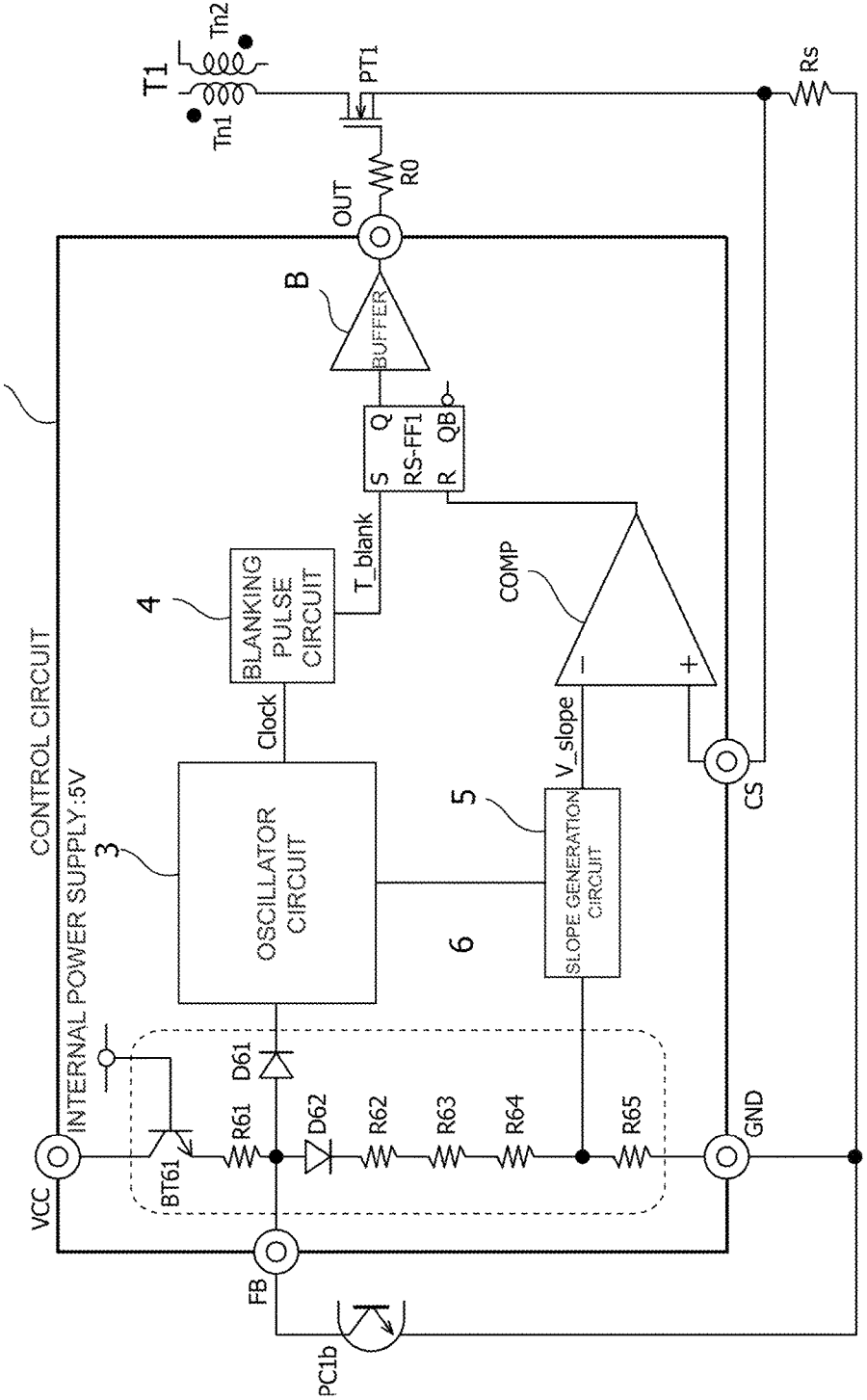
FIG. 7 illustrates a control circuit provided in the conventional switching power supply apparatus.

FIG. 1 shows the configuration of a control circuit 2a. Note that the same components as those in FIG. 7 are indicated by the same reference numerals and description thereof will be omitted. The control circuit 2a of FIG. 1 includes a current detection comparator COMPa in place of the current detection comparator COMP in the control circuit 2 of FIG. 7. The current detection signal, indicating a detected value of a current flowing through the switching element PT1, is input to the positive input terminal of the current detection comparator COMPa. The slope signal V_slope is input to the negative input terminal of the current detection comparator COMPa.

In addition, the blanking pulse signal T_blank from the blanking pulse generating circuit 4 is also input to the current detection comparator COMPa. The comparison signal output by the current detection comparator COMPa is input to the reset terminal of the RS flip-flop circuit RS-FF1. The current detection comparator COMPa is configured to set the comparison signal to low level independently of the current detection signal and the slope signal V_slope, when the blanking pulse signal T_blank indicating that it is currently in a blanking period is input to the current detection comparator COMPa.

Figure 2:
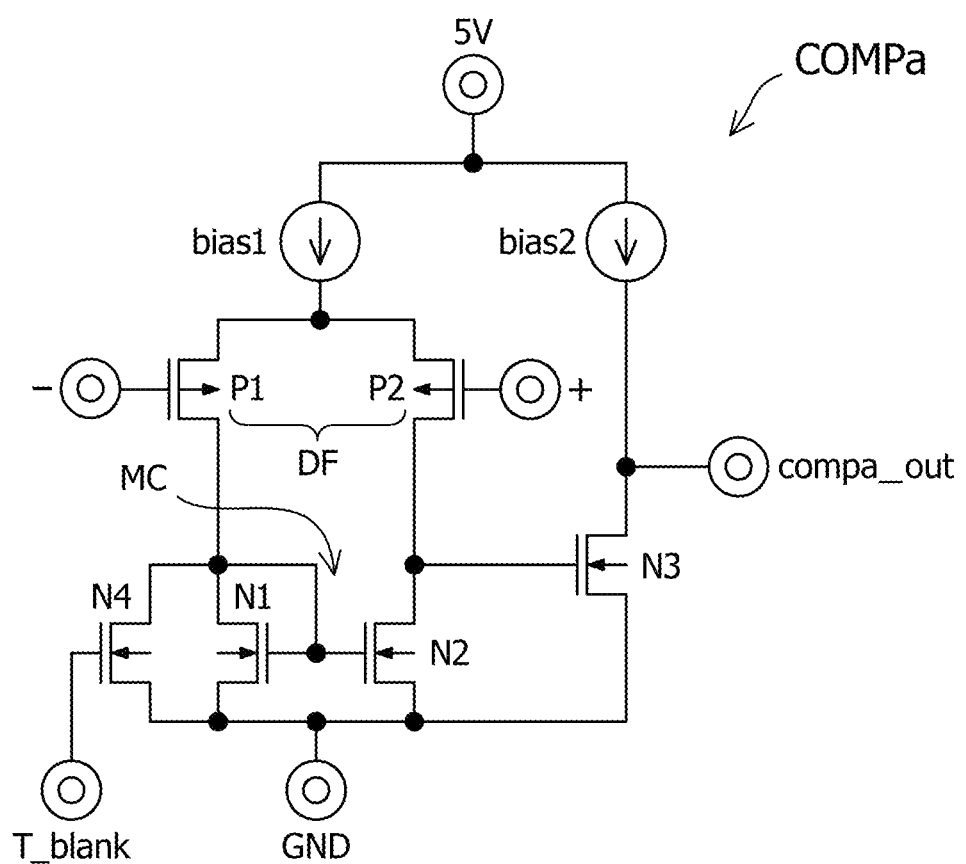
FIG. 2 illustrates an exemplary configuration of a comparator provided in a control circuit according to the first embodiment.
Figure 8:
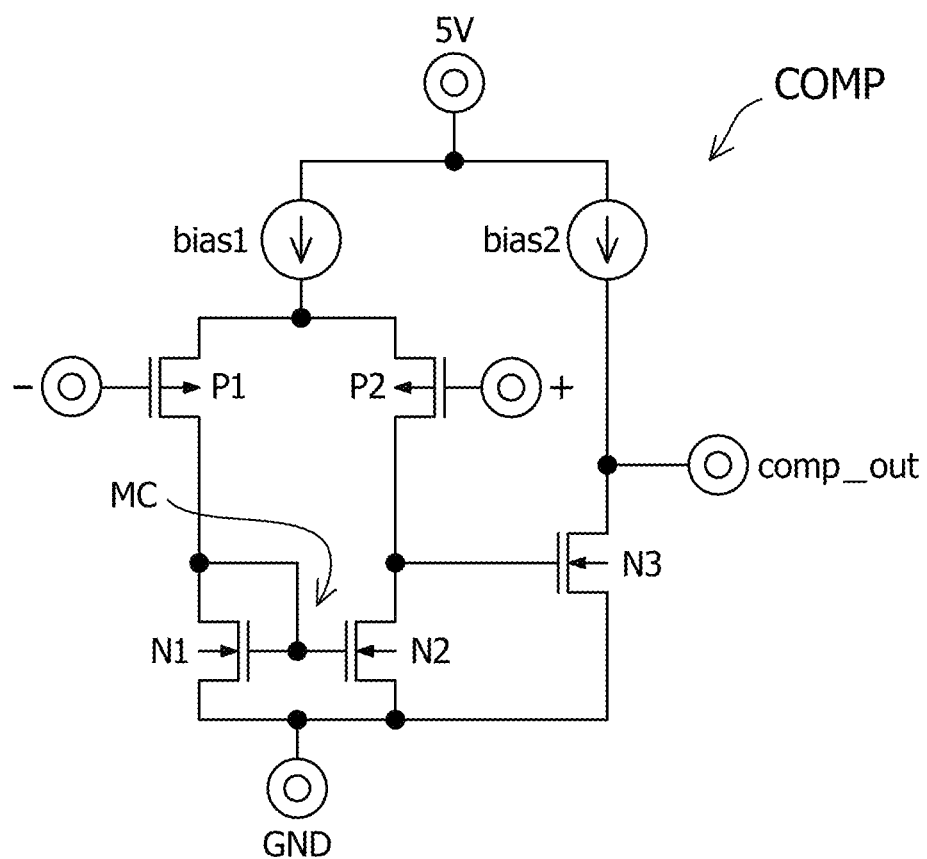
FIG. 8 illustrates an exemplary configuration of a comparator provided in the conventional control circuit.
Figure 9:
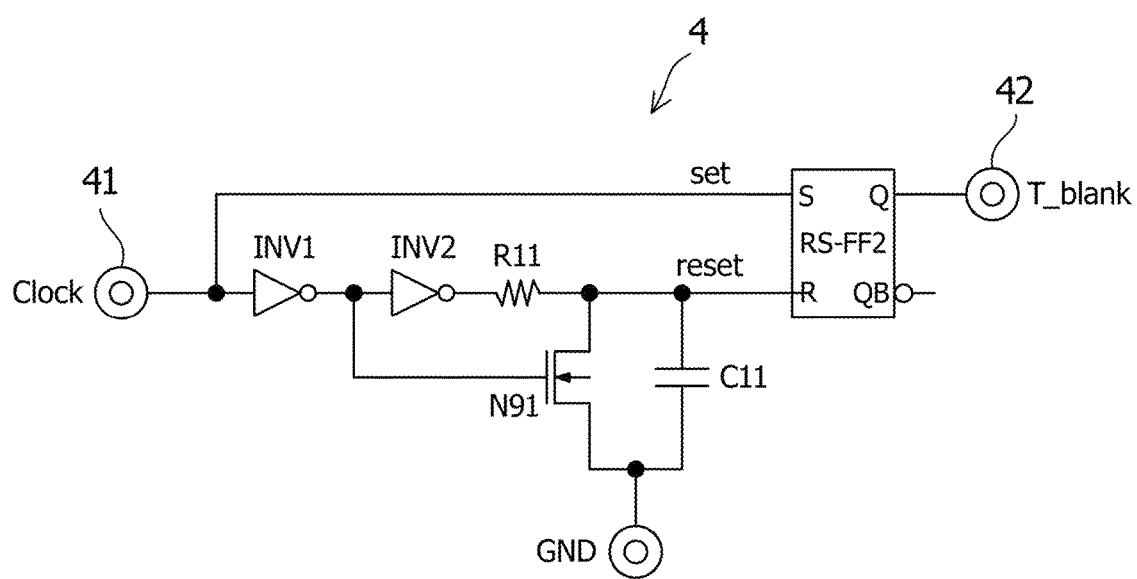
FIG. 9 illustrates an exemplary configuration of a blanking pulse generating circuit provided in the conventional control circuit.
Figure 10:
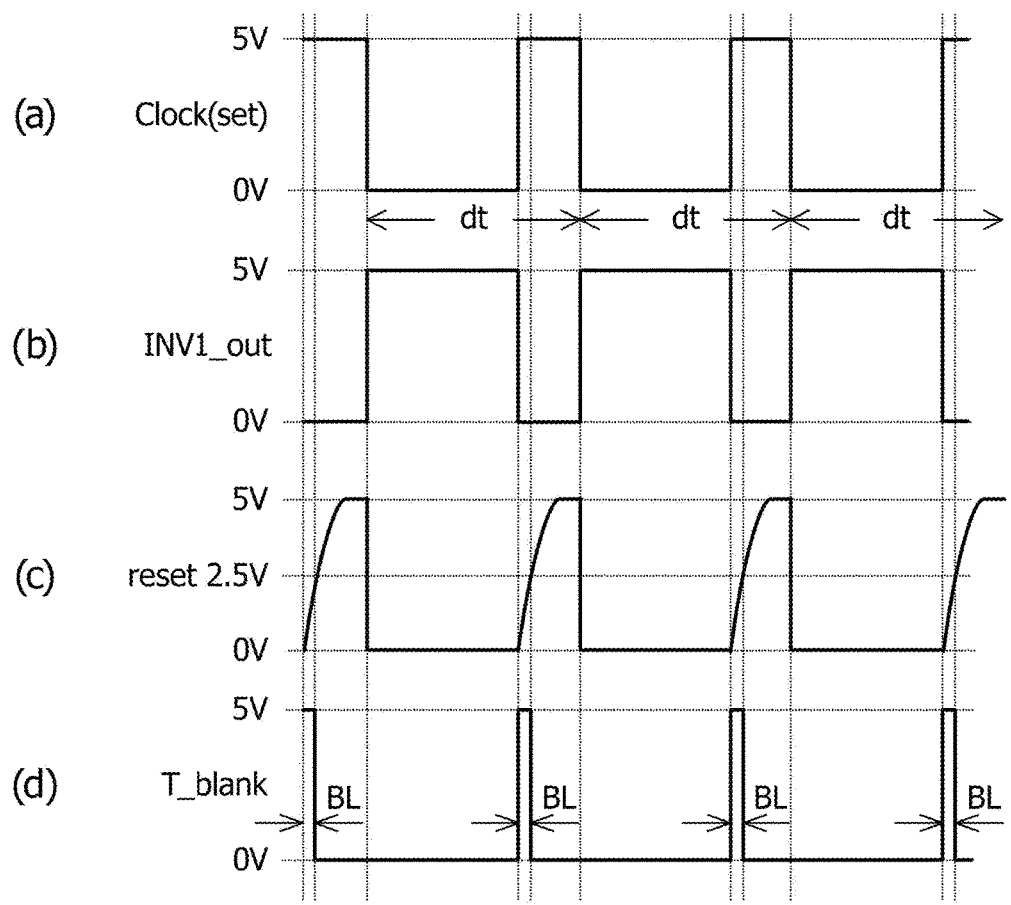
FIG. 10 is a timing chart showing the operation of a blanking pulse generating circuit.

FIG. 2 shows the configuration of the current detection comparator COMPa. Note that the same components as those in FIG. 8 are indicated by the same reference numerals and description thereof will be omitted. As shown in FIG. 2, the current detection comparator COMPa further includes an N-type MOS transistor N4. The source of the N-type MOS transistor N4 is connected to ground. The drain of the N-type MOS transistor N4 is connected to the drains of the N-type MOS transistor N1 and the P-type MOS transistor P1 and to the gates of the N-type MOS transistors N1, N2. The blanking pulse signal T_blank output from the blanking pulse generating circuit 4 is applied to the gate of the N-type MOS transistor N4.

When the blanking pulse signal T_blank is high level, the N-type MOS transistor N4 is turned on. As a result, the negative-input-side output terminal of the differential pair DF including the P-type MOS transistors P1 and P2 (i.e., the drain of the P-type MOS transistor P1) and the input terminal of the current mirror circuit MC are short-circuited to the source of the current mirror circuit MC (i.e., short-circuited to ground). In this way, the N-type MOS transistor N4 serves as a switch for short-circuiting, to ground, the negative-input-side output terminal of the differential pair DF and the input terminal of the current mirror circuit MC in the current detection comparator COMPa when the blanking pulse signal is high level.

As a result of such short circuit, the gate voltages of the N-type MOS transistors N1, N2 become equal to ground, and the transistors N1 and N2 become both turned off. Meanwhile, at least in the beginning of the blanking period, a current flows through the P-type MOS transistor P2 so as to charge the gate capacitance of the N-type MOS transistor N3 since the voltage VCS, which is the current detection signal input to the gate of the P-type MOS transistor P2, is sufficiently low. As a result, the gate voltage of the N-type MOS transistor N3 becomes high level. In other words, one output (the drain of the P-type MOS transistor P2) of the differential portion, which includes the constant current source bias1, the P-type MOS transistors P1 and P2 of the differential pair DF, and the N-type MOS transistors N1 and N2, becomes high level. In response, the N-type MOS transistor N3 becomes turned on. As a result, the voltage of the comparison signal at the output terminal compa_out of the current detection comparator COMPa is low level (ground level). As described above, the current detection comparator COMPa is configured to output the comparison signal at low level by invalidating the output of the differential pair DF when the blanking pulse signal T_blank is high level.

Figure 3:
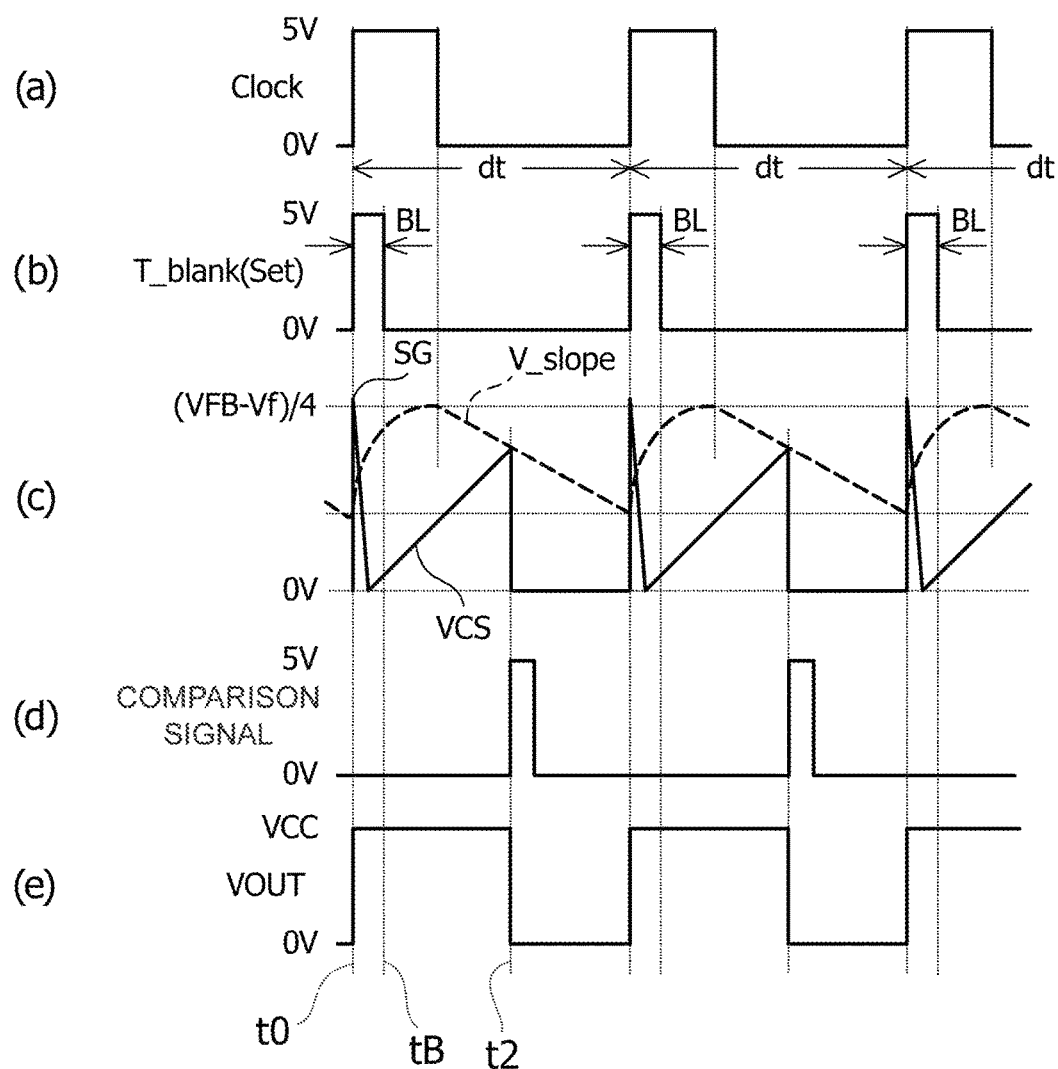
FIG. 3 is a timing chart showing the operation of the control circuit according to the first embodiment under heavy load.

The operation of the control circuit 2a under heavy load will be described with reference to FIG. 3. The comparison signal of the current detection comparator COMPa is low level during the blanking period BL from time point t0 to time point tB, and is maintained at low level after the blanking period BL. Then, the voltage VCS of the current detection signal of the switching element PT1 exceeds the slope signal V_slope at time point t2, which is later than time point tB. In response, the comparison signal of the current detection comparator COMPa becomes high level. This brings, to low level, the voltage VOUT which has been high level since time point t0. This low-level shift of the voltage VOUT turns off the switching element PT1, and brings the voltage VCS which is the current detection signal back to low level.

Figure 11:
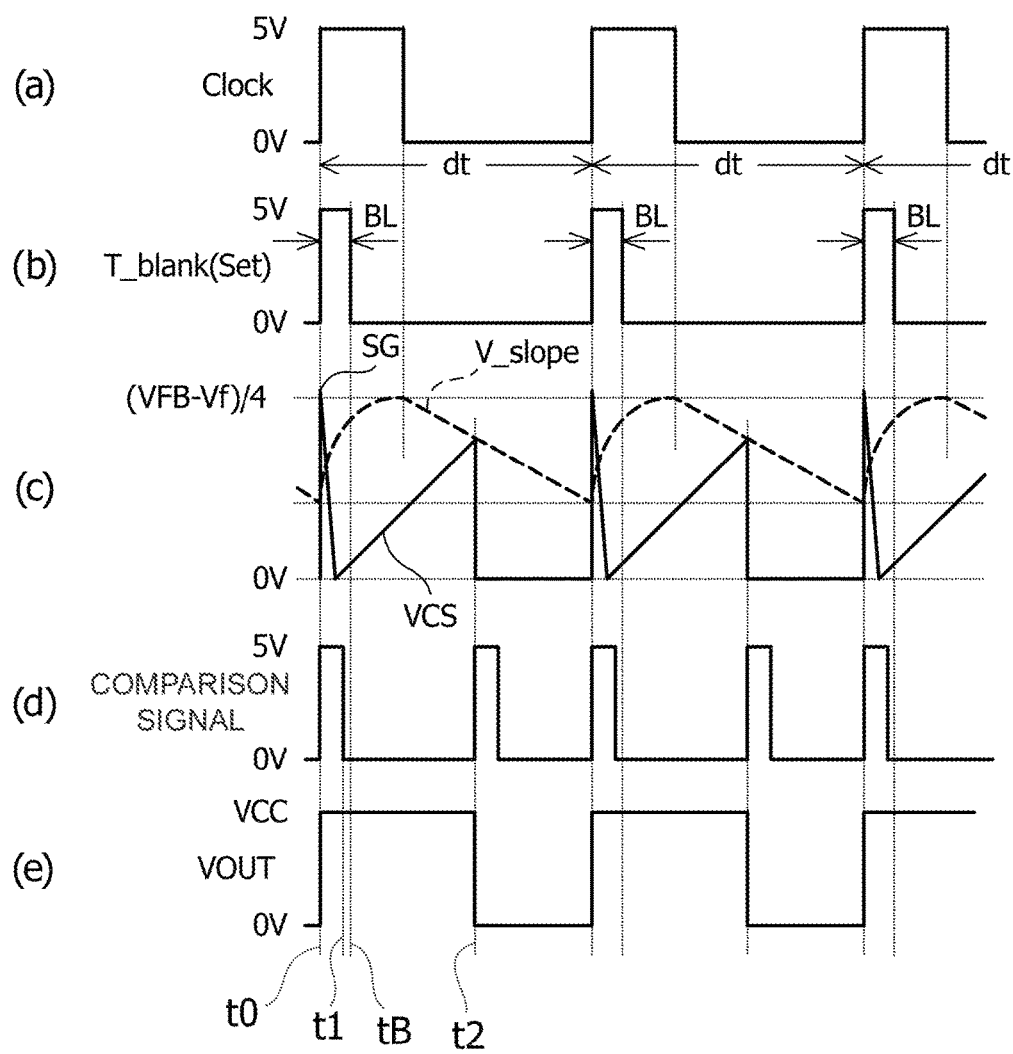
FIG. 11 is a timing chart showing the operation of the control circuit under heavy load.

As described above, FIG. 3 is different from FIG. 11 in that the comparison signal of the current detection comparator COMPa is set to low level (ground level) during the blanking period. Meanwhile, in FIG. 3, the voltage VOUT changes in a similar manner as in FIG. 11.

Figure 4:
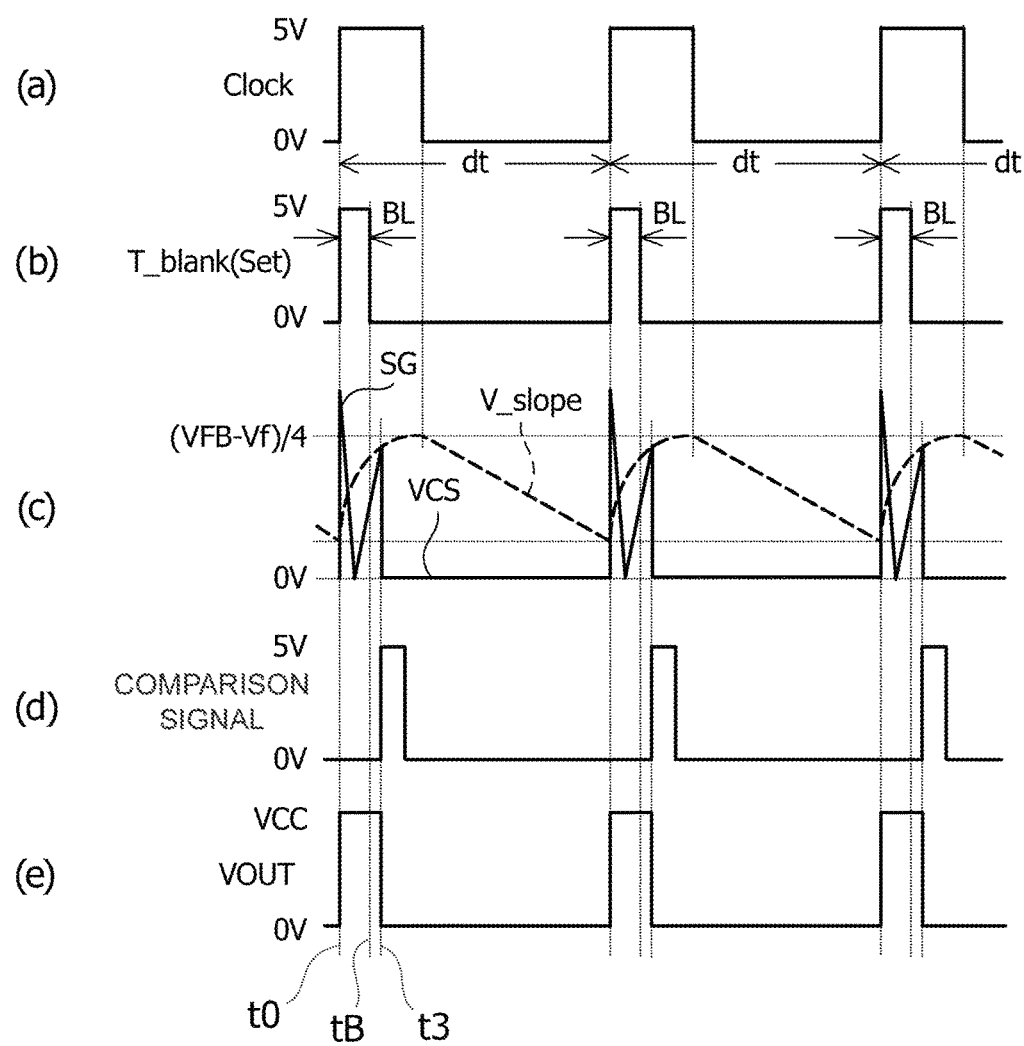
FIG. 4 is a timing chart showing the operation of the control circuit according to the first embodiment under light load.
Figure 12:
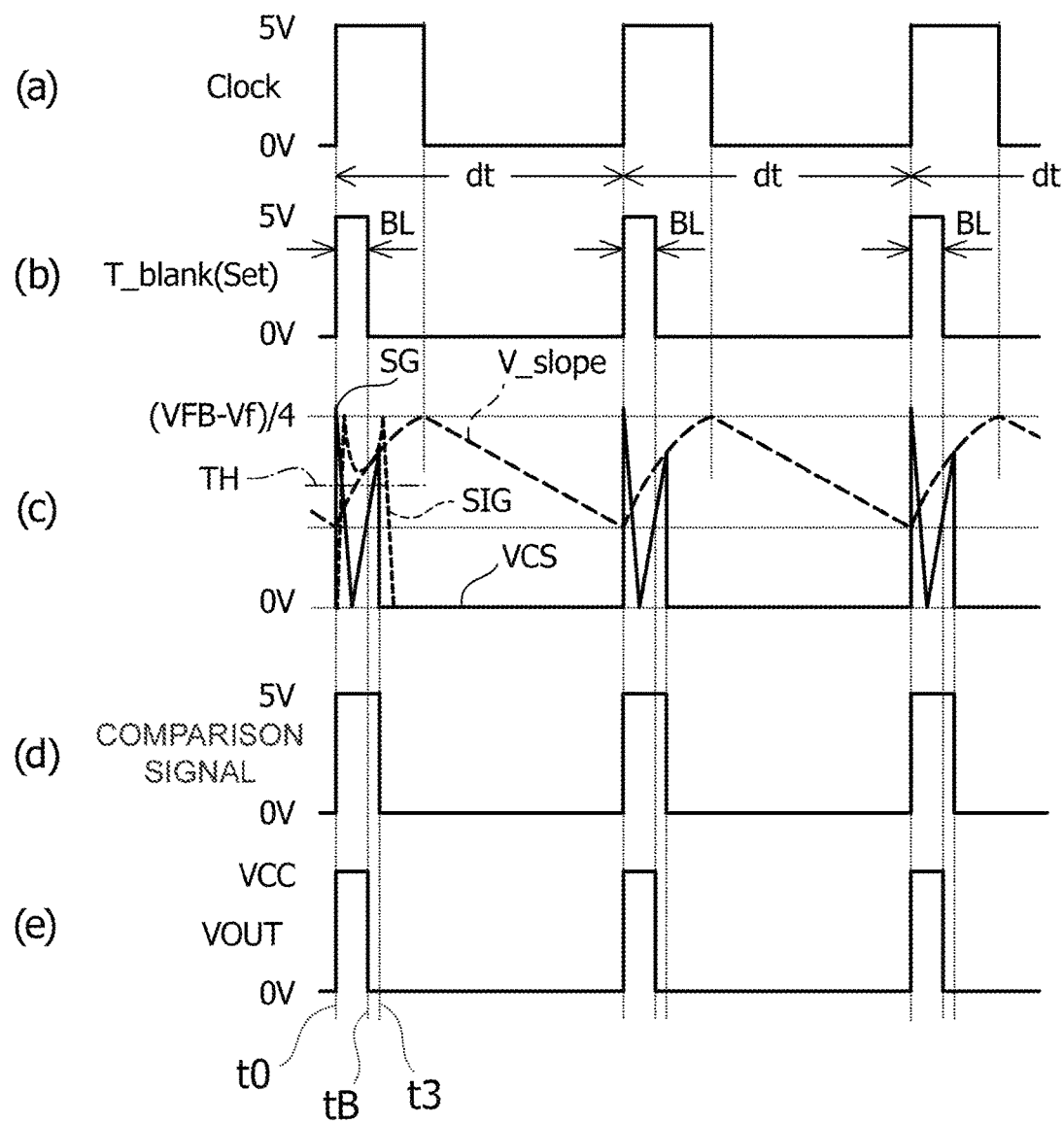
FIG. 12 is a timing chart showing the operation of the control circuit under light load.
Figure 13:
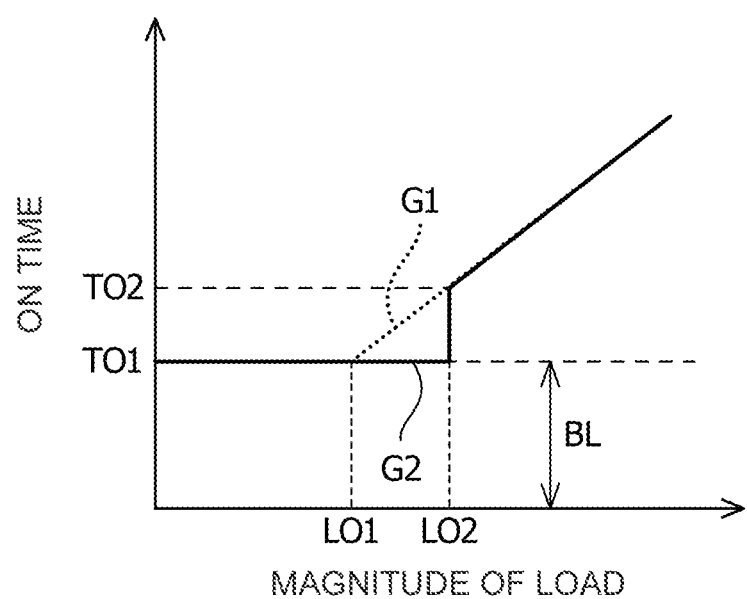
FIG. 13 is a graph showing the relationship between the magnitude of the load and the ON time of the switching element.

Next, the operation of the control circuit 2a under light load will be described with reference to FIG. 4. The comparison signal of the current detection comparator COMPa is kept at low level during the blanking period BL whether or not the surge voltage SG is generated. Then, the voltage VCS exceeds the slope signal V_slope at time point t3 immediately after the end of the blanking period. In response, the comparison signal becomes high level for the first time since time point t0. At this time point t3, the voltage VOUT, which has been high level since time point t0, becomes low level. In other words, unlike in FIG. 12, the voltage VOUT is prevented from being low level at time point tB, which is prior to time point t3. This allows for establishment of the intended duty cycle, which is as indicated by dotted line G1 in FIG. 13.

As described above, using the control circuit 2a allows the actual duty cycle to continuously change as designed, and thus can suppress sound generation.

It is possible to obtain a duty cycle as designed and suppress sound generation by replacing, in the configuration of the control circuit 2 shown in FIG. 7, the current detection comparator COMP with a comparator having a fast response. However, a comparator having a fast response is expensive. On the other hand, the control circuit 2a shown in FIGS. 1 and 2 can suppress sound generation by a relatively simple method of adding the N-type MOS transistor N4 to the comparator, irrespective of the response speed of the comparator. Thus, the control circuit 2a can suppress sound generation without using an expensive comparator.

The inventor focused on the disadvantage of the conventional switching power supply apparatus that it cannot output the intended duty cycle under light load depending on the response speed of the comparator included, during the blanking period. In seeking a solution to this, the inventor has hit upon an idea that it is not at all necessary to operate the differential portion of the comparator during the blanking period. Based on this idea, the inventor has completed the embodiment shown in FIGS. 1 and 2.

Second Embodiment

Figure 5:
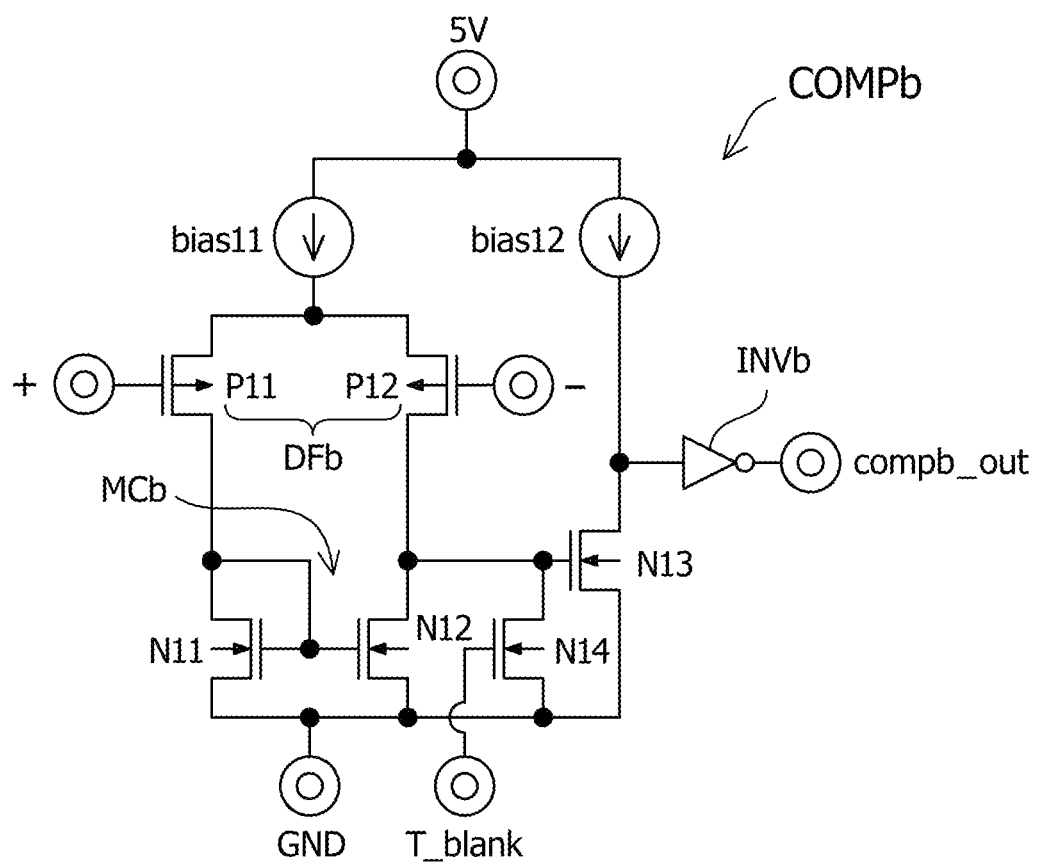
FIG. 5 illustrates another exemplary configuration of a comparator.
Figure 6:
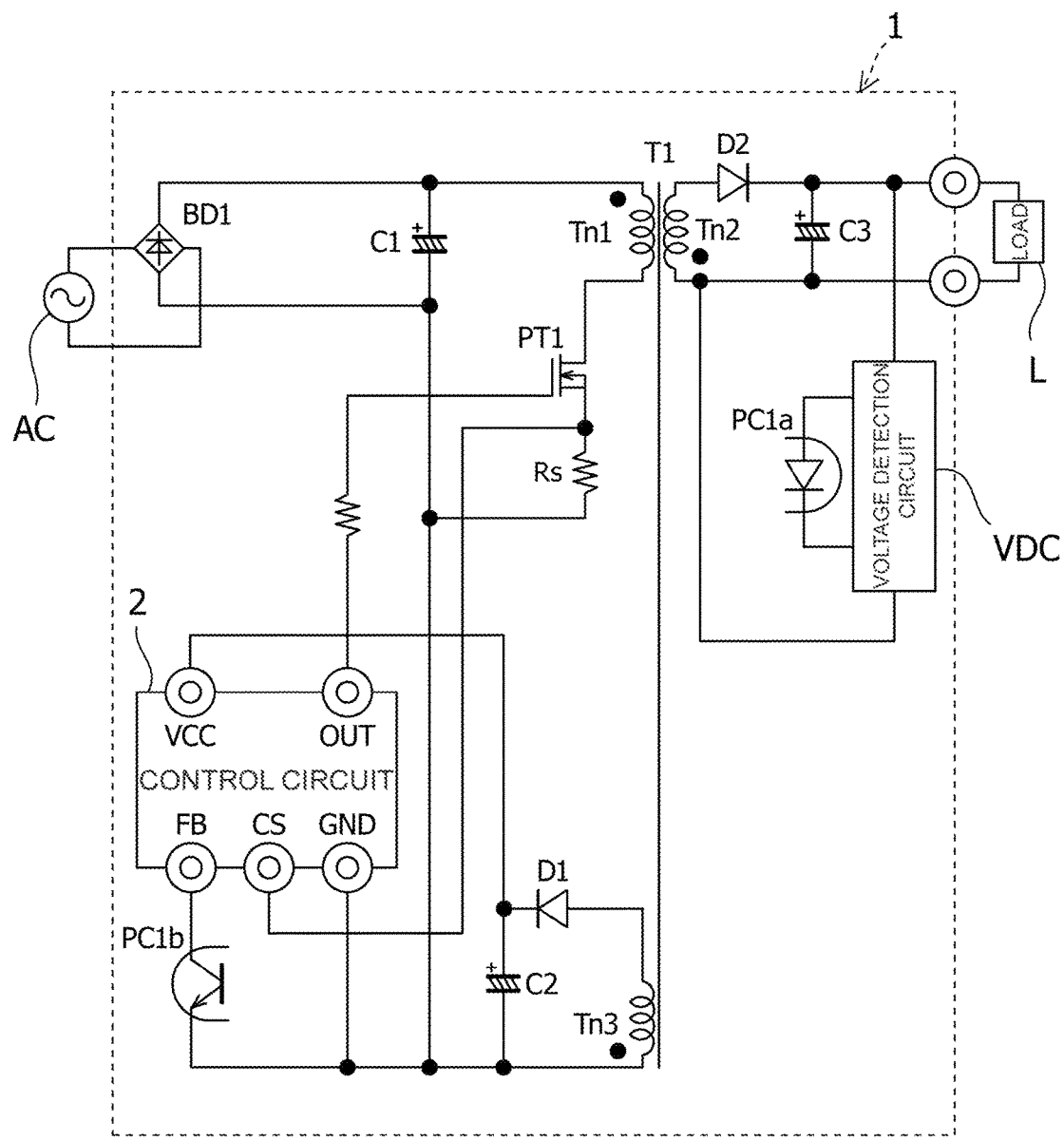
FIG. 6 illustrates an exemplary configuration of a conventional switching power supply apparatus.

The current detection comparator COMPb shown in FIG. 5 may be used in place of the current detection comparator COMPa shown in FIG. 2.

Like the current detection comparator COMPa, the current detection comparator COMPb operates with a voltage supply of 5 V. This voltage is supplied to constant current sources bias11 and bias12.

The positive input terminal and the negative input terminal of the current detection comparator COMPb are connected to the gate of a P-type MOS transistor P11 and the gate of a P-type MOS transistor P12, respectively. The constant current source bias11 is connected to the sources of the P type MOS transistors P11 and P12.

A current mirror circuit MCb including N-type MOS transistors N11 and N12 is connected to the drains of the P-type MOS transistors P11 and P12. The sources of the transistors N11 and N12 are both connected to ground.

An N-type MOS transistor N13 is connected to ground and the constant current source bias12. The gate of the N-type MOS transistor N13 is connected to the drains of the P-type MOS transistor P12 and the N-type MOS transistor N12. The drain of the N-type MOS transistor N13 and the constant current source bias12 are connected to the input terminal of an inverter INVb. The output terminal of this inverter INVb is connected to the output terminal comp-b_out of the current detection comparator COMPb.

The current detection comparator COMPb further includes an N-type MOS transistor N14. The source of the N-type MOS transistor N14 is connected to ground. The drain of the N-type MOS transistor N14 is connected to the gate of the N-type MOS transistor N13 and the drains of the P-type MOS transistor P12 and the N-type MOS transistor N12. The blanking pulse signal T_blank output from the blanking pulse generating circuit 4 is applied to the gate of the N-type MOS transistor N14.

The constant current source bias11, the P-type MOS transistors P11 and P12 of the differential pair DFb, and the N-type MOS transistors N11 and N12 constitute a differential portion of the current detection comparator COMPb. The constant current source bias12, the N-type MOS transistor N13, and the inverter INVb constitute an output portion of the current detection comparator COMPb.

When the blanking pulse signal T_blank is high level, the N-type MOS transistor N14 is turned on. As a result, the output of the differential portion is fixed to low level. Thus, the N-type MOS transistor N13 is turned off. In addition, the drain voltage of the N-type MOS transistor N13 is fixed to high level, and the output of the inverter INVb is fixed to low level. As a result, the output compb_out is fixed to low level. In other words, the comparison signal is fixed to low level during the blanking period.

As described above, when the blanking pulse signal T_blank is high level, the output of the differential portion is low level and the comparison signal is low level. The N-type MOS transistor N14 serves as a switch for short-circuiting, to ground, one output of the differential portion in the current detection comparator COMPb when the blanking pulse signal is high level.

The size of the N-type MOS transistor N14 has only to be large enough to withstand a current that flowing through the constant current source bias11, thus as large as those of the N-type MOS transistors N11 and N12.

The control circuit including the device current detection comparator COMPb as described above also operates as shown in FIGS. 3 and 4.

[Others]

The source voltage of the current mirror circuit MC in FIG. 2 is not limited to ground but may be a predetermined reference voltage of the control circuit 2a. The same is true for the current mirror circuit MCb in FIG. 5.

The period during which the blanking pulse signal is low level may be used as the blanking period by appropriately changing the processing circuit. The length of the blanking period may be either constant or variable. In any of these configurations, the current detection comparator can be configured such that the comparison signal is low level during the blanking period.

A voltage to be compared with the current detection signal may be input to the negative input terminal of the current detection comparator.

The specific embodiments of the present invention have been described above.

However, the present invention is not limited to such embodiments, and various modifications based on the technical idea of the present invention are included in the technical concept of the present invention.

REFERENCE SYMBOLS LIST 1 switching power supply apparatus
2 control circuit
3 oscillator circuit
4 blanking pulse generating circuit
5 slope generation circuit
6 feedback circuit
PT1 switching element
COMP current detection comparator
2a control circuit
COMPa current detection comparator
N4 N-type MOS transistor (switch)
COMPb current detection comparator
N14 N-type MOS transistor (switch)

What is claimed is:

1. A control circuit for a switching power supply apparatus, comprising:
    a pulse circuit to generate a blanking pulse signal that causes the control circuit to switch on a switching element of the switching power supply apparatus when the blanking pulse signal changes from a baseline level to a level indicating that it is currently in a predetermined period set to ensure that the switching element is not turned off for the predetermined period after the switching element has been turned on; and
    a comparator configured to compare a voltage corresponding to a current flowing through the switching element with a voltage to be compared therewith, and configured to output a comparison signal corresponding to a result of the comparison, wherein
    the blanking pulse signal is also input to the comparator,
    when the blanking pulse signal is at the level indicating that it is currently in the predetermined period, the comparison signal is set to a low level independently of the voltage corresponding to the current and the voltage to be compared therewith,
    the comparator includes a differential portion and an output portion to which one output of the differential portion is input, and
    when the blanking pulse signal is at the level indicating that it is currently in the predetermined period, the one output of the differential portion is fixed to a high level or a low level.

2. The control circuit for the switching power supply apparatus, according to claim 1, wherein the comparator further includes a switch configured to connect the one output of the differential portion to a reference voltage of the control circuit when the blanking pulse signal is at the level indicating that it is currently in the predetermined period.

3. The control circuit for the switching power supply apparatus, according to claim 1, wherein
    the differential portion of the comparator includes a differential pair and a current mirror circuit connected to the differential pair, the current mirror circuit having an output terminal connected to the output portion, and
    the comparator further includes a switch configured to connect an input terminal of the current mirror circuit to a reference voltage of the control circuit when the blanking pulse signal is at the level indicating that it is currently in the predetermined period.

4. A control circuit for a switching power supply apparatus, comprising:
    a pulse circuit to generate a blanking pulse signal that causes the control circuit to switch on a switching element of the switching power supply apparatus when the blanking pulse signal changes from a baseline level to a level indicating that it is currently in a predetermined period set to ensure that the switching element is not turned off for the predetermined period after the switching element has been turned on; and
    a comparator configured to compare a voltage corresponding to a current flowing through the switching element with a voltage to be compared therewith, and configured to output a comparison signal corresponding to a result of the comparison, wherein
    the blanking pulse signal is also input to the comparator, and
    when the blanking pulse signal is at the level indicating that it is currently in the predetermined period, the comparison signal is set to a low level independently of the voltage corresponding to the current and the voltage to be compared therewith.

* * * * *